United States Patent
Miller et al.

(10) Patent No.: US 9,928,997 B2
(45) Date of Patent: Mar. 27, 2018

(54) APPARATUS FOR PVD DIELECTRIC DEPOSITION

(71) Applicant: APPLIED MATERIALS, INC., Santa Clara, CA (US)

(72) Inventors: Keith A. Miller, Mountain View, CA (US); Thanh X. Nguyen, San Jose, CA (US); Ilya Lavitsky, San Francisco, CA (US); Randy Schmieding, Saratoga, CA (US); Prashanth Kothnur, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 221 days.

(21) Appl. No.: 14/616,895

(22) Filed: Feb. 9, 2015

(65) Prior Publication Data

US 2016/0172168 A1   Jun. 16, 2016

Related U.S. Application Data

(60) Provisional application No. 62/091,607, filed on Dec. 14, 2014.

(51) Int. Cl.
- *H01J 37/34* (2006.01)
- *C23C 14/34* (2006.01)
- *C23C 14/35* (2006.01)

(52) U.S. Cl.
CPC ........ *H01J 37/3452* (2013.01); *C23C 14/345* (2013.01); *C23C 14/3485* (2013.01); *C23C 14/352* (2013.01); *H01J 37/3408* (2013.01); *H01J 37/3417* (2013.01); *H01J 37/3467* (2013.01)

(58) Field of Classification Search
CPC .................................................. C23C 14/352
See application file for complete search history.

(56) References Cited

U.S. PATENT DOCUMENTS

| 4,601,806 | A | * | 7/1986 | Wirz | .................. | H01J 37/3426 |
| | | | | | | 204/298.12 |
| 6,784,085 | B2 | | 8/2004 | Cuomo et al. | | |
| 8,083,911 | B2 | | 12/2011 | Hanika et al. | | |
| 2004/0045670 | A1 | * | 3/2004 | Tepman | .............. | H01J 37/3497 |
| | | | | | | 156/345.37 |

(Continued)

FOREIGN PATENT DOCUMENTS

| JP | 10-219940 A | 8/1998 |
| KR | 10-2013-0025407 A | 3/2013 |

OTHER PUBLICATIONS

International Search Report and Written Opinion dated Jan. 29, 2016 for PCT Application No. PCT/US2015/055648.

*Primary Examiner* — Timon Wanga
(74) *Attorney, Agent, or Firm* — Moser Taboada; Alan Taboada

(57) ABSTRACT

Apparatus for physical vapor deposition of dielectric material is provided herein. In some embodiments, a chamber lid of a physical vapor deposition chamber includes an inner magnetron assembly coupled to an inner target assembly, and an outer magnet assembly coupled to an outer target assembly, wherein the inner magnetron assembly and the inner target assembly are electrically isolated from the outer magnet assembly and the outer target assembly.

18 Claims, 3 Drawing Sheets

(56) References Cited

U.S. PATENT DOCUMENTS

| | | | |
|---|---|---|---|
| 2007/0056843 A1* | 3/2007 | Ye | C23C 14/352 204/192.1 |
| 2007/0072434 A1 | 3/2007 | Wen | |
| 2007/0181417 A1* | 8/2007 | Chistyakov | C23C 14/352 204/192.1 |
| 2007/0261957 A1* | 11/2007 | Takahashi | C23C 14/352 204/298.16 |
| 2010/0181191 A1 | 7/2010 | Tamagaki | |
| 2013/0136873 A1* | 5/2013 | Kao | C23C 14/352 427/598 |

\* cited by examiner

APPARATUS FOR PVD DIELECTRIC DEPOSITION

CROSS-REFERENCE TO RELATED APPLICATIONS

This application claims benefit of U.S. provisional patent application Ser. No. 62/091,607, filed Dec. 14, 2014, which is herein incorporated by reference in its entirety.

FIELD

Embodiments of the present disclosure relate to an apparatus for processing substrates in a physical vapor deposition chamber. Particularly, embodiments of the present disclosure relate to an apparatus for physical vapor deposition (PVD) dielectric deposition.

BACKGROUND

In semiconductor processing, physical vapor deposition (PVD) is a conventionally used process for depositing a thin film. A PVD process generally includes bombarding a target comprising a source material with ions from a plasma, causing the source material to be sputtered from the target. The ejected source material is then accelerated towards a substrate being processed via a voltage bias, resulting in a deposition of the source material with or without reaction with other reactant.

In recent years, PVD process has been increasingly used to deposit dielectric materials replacing chemical vapor deposition (CVD). Compared to dielectric films formed by CVD, dielectric films formed by PVD have less contamination, thus, higher quality. Typical pulsed DC PVD vacuum chamber hardware contains a substrate pedestal, a process kit, including process shield (s), and a source, including a target. Usually, the target (cathode) is charged and the process shield is grounded (anode) to sustain plasma. Using the shield as an anode operates well with metal deposition but creates problems with dielectric deposition.

However, depositing dielectric material in a PVD chamber is accompanied by inner surfaces of the PVD chamber slowly coated by a non-conductive dielectric material. Because inner shields of PVD chambers function as system anodes during processing, the dielectric coating on the inner surfaces can cause variation in circuit impedance and voltage distribution. The dielectric coating may also change plasma distribution inside the PVD chamber thus negatively impacts deposition rate and uniformity of film thickness. Ultimately, the dielectric coating may even cause circuit interruption and disappearing anode problems. As a result, a metal pasting process is used on the shield to recover the grounding (anode). The pasting process hinders throughput performance of the chamber.

Thus, there is need for apparatus for maintaining the inner surfaces of a PVD chamber conductive during deposition of dielectric materials.

SUMMARY

Apparatus for physical vapor deposition of dielectric material is provided herein. In some embodiments, a chamber lid of a physical vapor deposition chamber includes an inner magnetron assembly coupled to an inner target assembly, and an outer magnet assembly coupled to an outer target assembly, wherein the inner magnetron assembly and the inner target assembly are electrically isolated from the outer magnet assembly and the outer target assembly.

In some embodiments, a physical vapor deposition chamber includes an inner magnetron assembly coupled to an inner target assembly, wherein the inner magnetron assembly includes an inner magnetron housing configured to contain a coolant, and an outer magnetron assembly coupled to an outer target assembly, wherein the outer target assembly includes an outer target backing plate including a coolant channel, and wherein the outer magnet assembly includes an outer magnetron housing with a coolant channel formed therein to supply coolant to the coolant channel formed in the outer target assembly.

In some embodiments, a physical vapor deposition chamber includes a chamber body having a first volume, a chamber lid disposed atop the chamber body, including an inner rotating magnetron assembly coupled to an inner target assembly, and an outer non-rotating magnet assembly coupled to an outer target assembly, wherein the inner rotating magnetron assembly and the inner target assembly are electrically isolated from the outer non-rotating magnet assembly and the outer target assembly, a DC power source that is configured to provide DC pulsed power to the inner target assembly and the outer target assembly, a substrate support disposed within the first volume, opposite the inner target assembly and the outer target assembly, and having a substrate processing surface, and a shield disposed within the chamber body comprising one or more sidewalls configured to surround the first volume, wherein the shield extends downwardly to below a top surface of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are thus not to be considered limiting of its scope, for the disclosure may admit to other equally effective embodiments.

Figure 1:
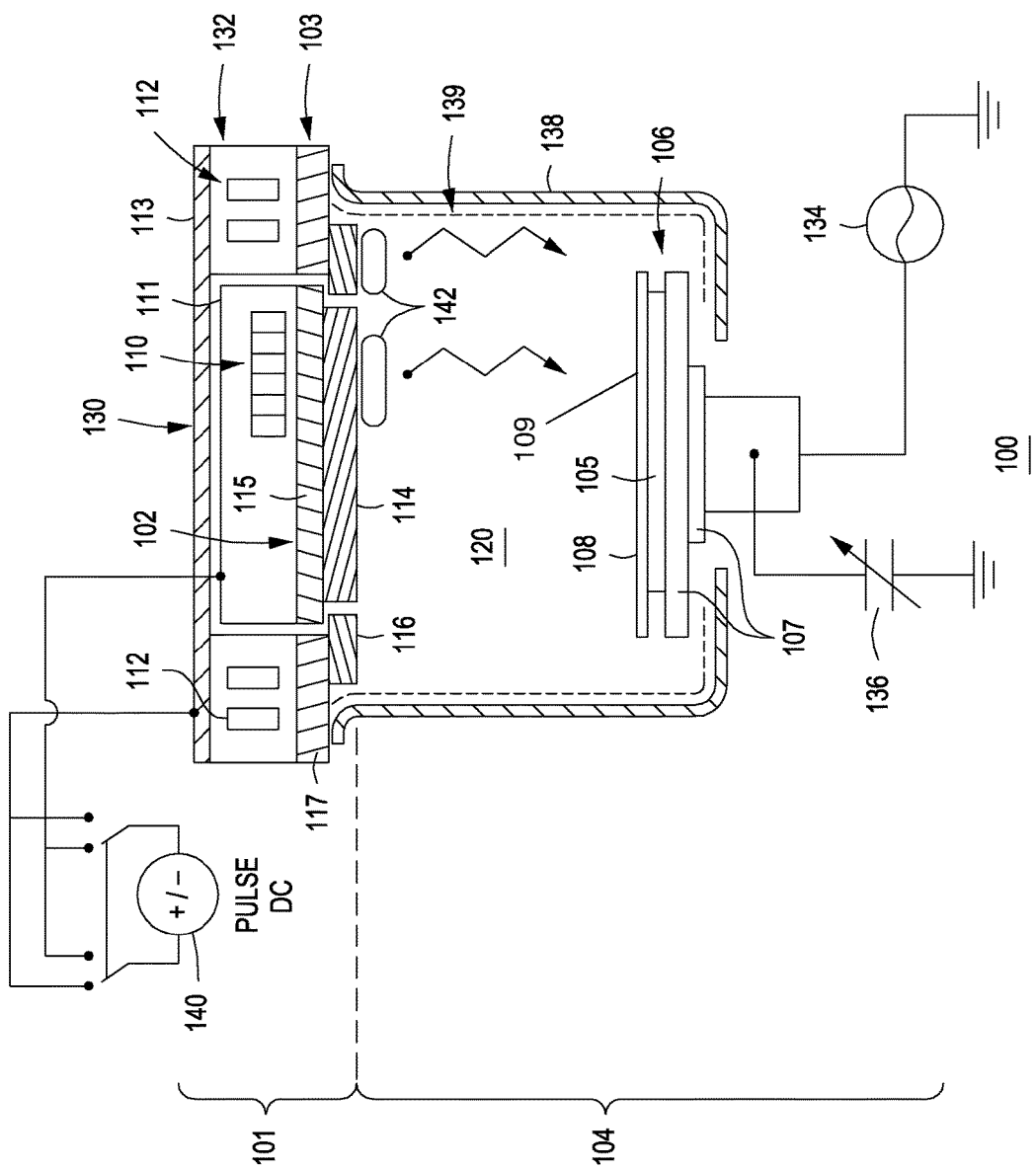
FIG. 1 depicts a schematic cross sectional view of a process chamber having a substrate support in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure include apparatus for maintaining the inner surfaces of a PVD chamber conductive during deposition of dielectric materials. In some embodiments, a PVD chamber is provided to eliminate the need for pasting at the same time improve uniformity and quality of a sputtered dielectric film. In embodiments consistent with the present disclosure, plasma sustainability during dielectric deposition processes does not rely on electrical conductivity of the process shield. Rather, plasma sustainability is advantageously achieved by changing design of the target assembly. More specifically, the target is divided into at least two electrically isolated zones (e.g., an inner and outer target). A pulsing voltage is switched between the zones which advantageously sustains the plasma in addition to reconditioning the target zones during operation. In some embodiments, there is a stationary magnetron proximate the outer target (outer cathode) and a moving/rotating magnetron proximate the inner target (inner electrode). In some embodiments, the backsides of one or both of the target assemblies are liquid cooled.

FIG. 1 depicts a simplified, cross-sectional view of a physical vapor deposition (PVD) chamber 100. The PVD chamber 100 comprises a substrate support 106 in accordance with some embodiments of the present disclosure. Exemplary PVD processing systems disclosed herein may include, but are not limited to, those of the ENDURA®, CENTURA®, or PRODUCER® line of processing systems, and the ALPS® Plus or SIP ENCORE® PVD process chambers, all commercially available from Applied Materials, Inc., of Santa Clara, Calif. Other process chambers, including those from other manufacturers, may also be suitably used in connection with the teachings provided herein.

In some embodiments of the present disclosure, the PVD chamber 100 includes a chamber lid 101 disposed atop a chamber body 104 and removable from the chamber body 104. The chamber lid 101 may include an inner target assembly 102 and an outer target assembly 103. The inner target assembly may include inner target 114 (e.g., dielectric target source material) coupled to a backing plate 115. The outer target assembly may include outer target 116 (e.g., dielectric target source material) coupled to an outer target backing plate 117. The chamber body 104 contains a substrate support 106 for receiving a substrate 108 thereon. The substrate support 106 may be located within the chamber body 104.

The substrate support 106 has a material-receiving surface facing a principal surface of inner target 114 and outer target and supports the substrate 108 to be sputter coated with material from the targets in planar position opposite to the principal surface of the inner target 114 and outer target 116. In some embodiments, the inner target 114 and outer target 116 may be made of a silicon compounds, aluminum compounds, titanium compounds, and the like. The inner target 114 and outer target 116 may be made of the same material to be deposited on the substrate 108. In some embodiments, the inner and outer targets 114, 116 may be made out of different materials. In some embodiments, the target material thickness can be different on the inner and outer targets 114, 116 for better target utilization. In some embodiments, this can be achieved by making the target backing plate bottoms position at different heights. Thus, the bottom of the targets could be coplanar, but the thickness of the inner and outer targets 114, 116 will be different from each other. The substrate support 106 may include a dielectric member 105 having a substrate processing surface 109 for supporting the substrate 108 thereon. In some embodiments, the substrate support 106 may include one or more first conductive members 107 disposed below the dielectric member 105. For example, the dielectric member 105 and the one or more first conductive members 107 may be part of an electrostatic chuck, RF electrode, or the like which may be used to provide chucking or RF power to the substrate support 106.

The substrate support 106 may support the substrate 108 in a first volume 120 of the chamber body 104. The first volume 120 may be a portion of the inner volume of the chamber body 104 that is used for processing the substrate 108 and may be separated from the remainder of the inner volume (e.g., a non-processing volume) during processing of the substrate 108. The first volume 120 is defined as the region above the substrate support 106 during processing (for example, between the targets 114, 116 and the substrate support 106 when in a processing position).

In some embodiments, the substrate support 106 may be vertically movable to allow the substrate 108 to be transferred onto the substrate support 106 through a load lock valve, or opening, (not shown) in the lower portion of the chamber body 104 and thereafter raised or lowered for a particular application. One or more gases may be supplied into the lower part of the chamber body 104.

An RF bias power source 134 may be coupled to the substrate support 106 in order to induce a negative DC bias on the substrate 108. In addition, in some embodiments, a negative DC self-bias may form on the substrate 108 during processing. For example, RF energy supplied by the RF bias power source 134 may range in frequency from about 2 MHz to about 60 MHz, for example, non-limiting frequencies such as 2 MHz, 13.56 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power may not be desired. Alternatively, or in combination, as indicated by the dashed box, the RF bias power source 134 may be a DC power source and may be coupled to a chucking electrode disposed in the substrate support 106 when the substrate support 106 is configured as an electrostatic chuck.

The chamber body 104 further includes a process kit shield, or shield 138, to surround the processing, or first volume of the chamber body 104 and to protect other chamber components from damage and/or contamination from processing. In some embodiments, the shield 138 may be a grounded shield, or otherwise connected to a grounded enclosure wall of the chamber body 104. The shield 138 may have a layer of dielectric material 139 deposited on it which occurs during processing of substrates during dielectric deposition. The shield 138 extends downwardly and is configured to surround the first volume 120. In some embodiments, the shield 138 may be made out of a ceramic material such as, for example, alumina oxide. In other embodiments, the shield 138 may be made out of a non-magnetic metal (e.g., aluminum or stainless steel).

As noted above, the plasma sustainability may be advantageously achieved, and the disappearing anode problem is resolved, by dividing the target into at least two electrically isolated zones (e.g., an inner target 114 and outer target 116). In some embodiments, there is a moving/rotating magnetron assembly 130 proximate the inner target 114 and a stationary magnetron assembly 132 proximate the outer target 116. The inner magnetron assembly 130 and an outer magnetron assembly 132 may be disposed in chamber lid 101 for selectively providing magnetic fields between the substrate support 106 and the targets 114, 116. In some embodiments, the inner magnetron assembly 130 includes a plurality of inner magnets 110 disposed in an inner magnetron housing 111. The number of inner magnets 110 may be between 1 and 45. In some embodiments, the outer magnetron assembly 132 includes a one or more pairs of outer magnets 112 disposed in an outer magnet housing 113. In some embodiments, the inner magnetron housing 111 and outer magnet housing 113 may be at least partially filled with a cooling fluid, such as water (e.g., deionized or distilled H$_2$O) or the like, which cools the magnetron assemblies 130, 132 and/or the target assemblies 102, 103.

The pulsing voltage from DC source 140 is switched between the inner target 114 and outer target 116 which advantageously sustains the plasma 142 in addition to reconditioning the targets 114, 116 during operation. The DC voltage may be supplied to inner target 114, forming an inner cathode, via conductive elements included in the inner magnetron assembly 130 (e.g., inner magnetron housing 111). The DC voltage may be supplied to outer target 116, forming an outer cathode, via conductive elements included in the outer magnetron assembly 132 (e.g., outer magnet housing 113). In some embodiments, the same DC source 140 may be coupled to the inner magnetron assembly 130 and the outer magnetron assembly 132. The DC source 140 may be able to independently provide power to the inner magnetron assembly 130 and the outer magnetron assembly 132. In other embodiments, DC source 140 may include multiple DC sources that are separately coupled to the inner magnetron assembly 130 and the outer magnetron assembly 132. In some embodiments, the pulsing voltage supplied by the DC source 140 may be about 200 -600 volts DC. In some embodiments, an optional RF capability source may be coupled to the inner target to provide RF power at a frequency range from 13.56-40 mhz 13.56-40 MHz and a power range from about 500 W - 5000 W.

Figure 2:
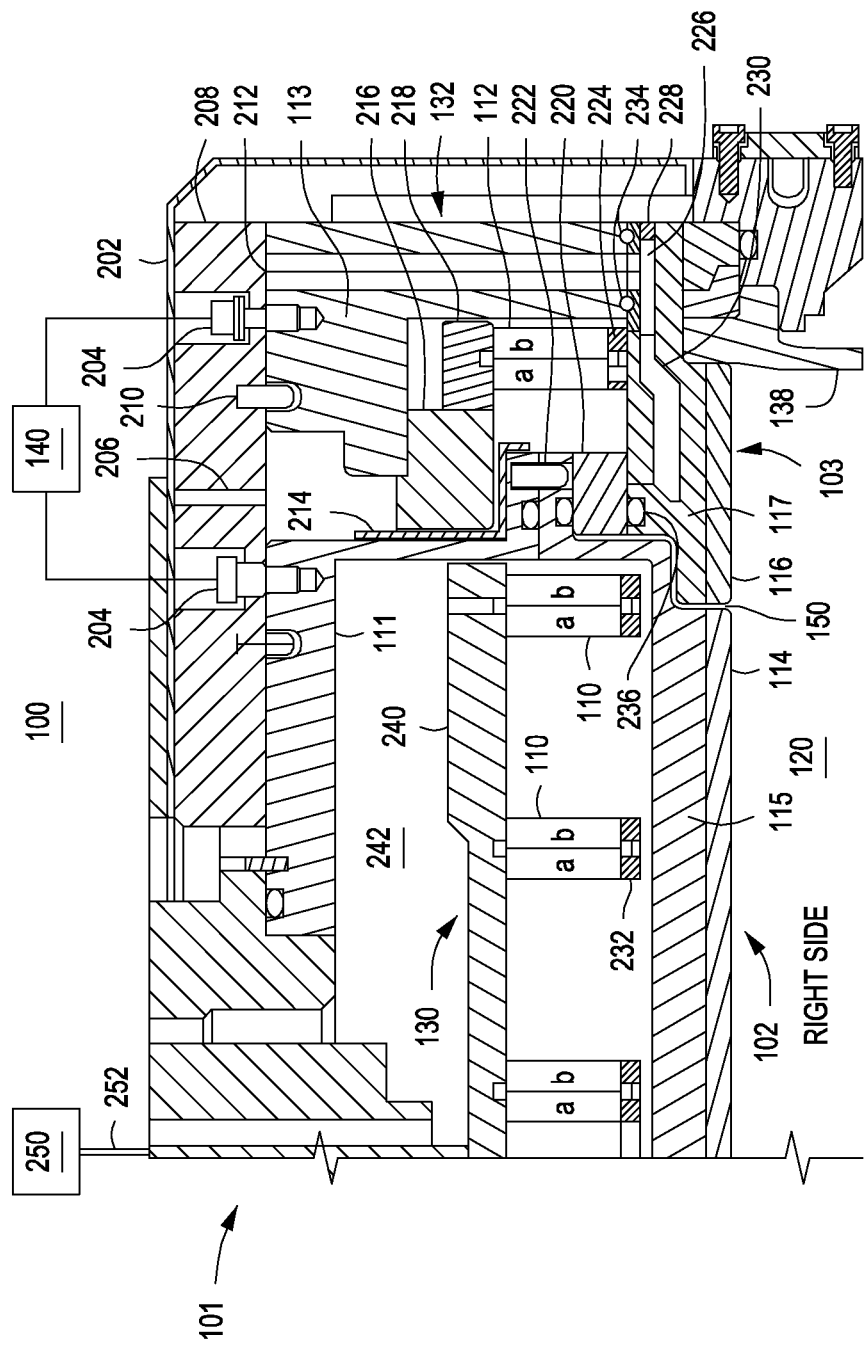
FIG. 2 depicts a schematic cross sectional view of a right side of PVD chamber lid in accordance with some embodiments of the present disclosure.
Figure 3:
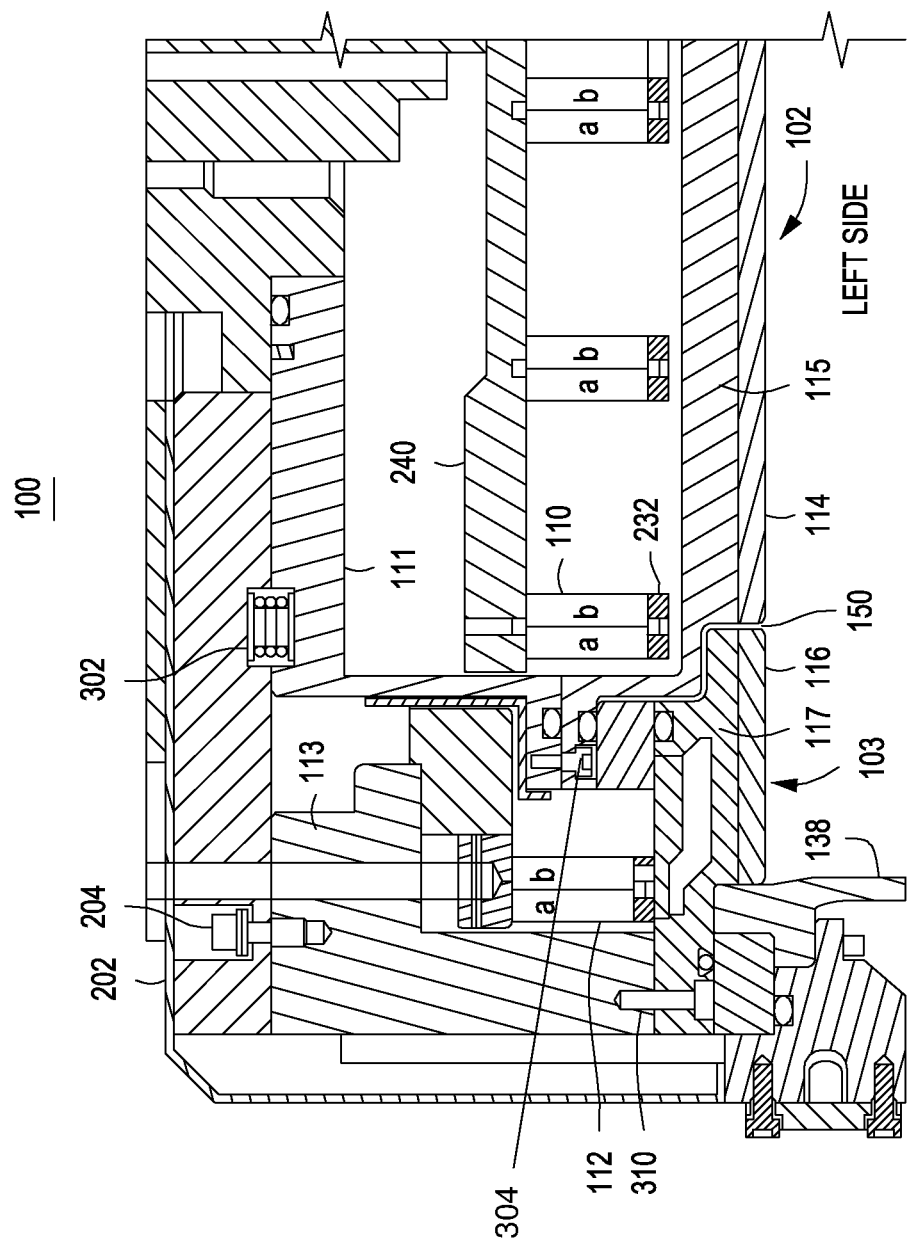
FIG. 3 depicts a schematic cross sectional view of a left side of PVD chamber lid in accordance with some embodiments of the present disclosure.

FIGS. 2 and 3 depict right and left cross-sectional views of a chamber lid 101 showing further details of the inventive target assemblies 102, 103 and magnetron assemblies 130, 132 disposed in the chamber lid in accordance with embodiments of the present disclosure.

The chamber lid 101 includes a chamber lid wall 202 that forms the external housing for the chamber lid 101. The inner magnetron housing 111 and outer magnetron housing 113 are secured to an electrical insulator 208 within the chamber lid 101 via hot screws 204. Electrical insulator 208 and inner and outer magnetron housings 111, 113 are aligned through the use of location pins 210. In some embodiments, the number of location pins 210 may be between 3 pins to 10 pins. In some embodiments, the electrical insulator 208 may include a moisture detection hole 206 for detection of leaks within the chamber lid 101. In some embodiments, the chamber lid wall 202 may be made from non-magnetic metal (e.g., aluminum or stainless steel). In some embodiments, the electrical insulator 208 is made out of fiberglass or polymer material.

In some embodiments, the DC source can independently provide pulsed DC power to the inner magnetron housing 111 and outer magnetron housing 113 via the hot screws 204. The inner and outer magnetron housings 111, 113 are made from a conductive metallic material, or otherwise coated with a conductive metallic material. In some embodiments, the inner magnetron housing 111 and outer magnetron housing 113 is electrically connected to DC source 140 through other connections between the magnetron housings and the DC source 140. In some embodiments, the bottom portion of the inner magnetron housing 111 may be formed by the inner target backing plate 115. Location pins 222 may assist in aligning/securing the inner magnetron housing 111 and the inner target backing plate 115. Similarly, in some embodiments, the bottom portion of the outer magnetron housing 113 may be formed by the outer target backing plate 117.

The inner and outer magnetron housings 111, 113 are electrically insulated from each other through various insulators disposed between inner and outer magnetron housings 111, 113 and inner and outer target assemblies 102, 103. For example, electrical insulators 208, and 214 and ceramic spacer 220, as well as the air between inner and outer magnetron housings 111, 113 and between inner and outer target assemblies 102, 103 electrically isolate the inner magnetron housing 111 and the inner target assembly 102 from the outer magnetron housing 113 and the outer target assembly 103.

The inner magnetron housing 111 includes an inner metal shunt 240 that supports inner magnets 110. The inner magnets are configured in pairs (a, b) and magnet includes a lower pole element 232. In some embodiments, each pair (a, b) of inner magnets 110 is an opposite polarity of the next nearest pair (a, b) of inner magnets 110. The inner magnetron housing 111 also includes a volume 242 that may be at least partially filled with a cooling fluid, such as water (H$_2$O) or the like which cools the inner magnetron assembly 130 and/or the inner target assemblies 102. In some embodiments, the inner metal shunt 240 is a disk shaped shunt that connects to a rotation shaft 252 coincident with the central axis of the chamber 100 and the substrate 108. In some embodiments, the rotation shaft 252 can be vertically adjusted to allow for vertical adjustment of the inner metal shunt 240 and the attached inner magnets 110. A motor 250 can be coupled to the upper end of the rotation shaft 252 to drive rotation of the inner magnetron assembly 130. The inner magnets 110 produce a magnetic field within the chamber 100, generally parallel and close to the surface of the inner target 114 to trap electrons and increase the local plasma density, which in turn increases the sputtering rate. The inner magnets 110 produce an electromagnetic field around the top of the chamber 100, and the magnets are rotated to rotate the electromagnetic field which influences the plasma density of the process to more uniformly sputter the inner target 114. For example, the rotation shaft 252 may make about 0 to about 150 rotations per minute.

The outer magnetron assembly 103 includes the outer magnetron housing 113 which includes one or more fluid channels 212 that is fluidly coupled to coolant channel 226 of the outer target backing plate 117 such that fluid channels 212 can provide coolant fluid, such as water (H$_2$O) or the like to water channels 226 and 230 within the outer target backing plate 117. The interface between fluid drilled channels 212 and the outer target backing plate 117 may be fluidly sealed via compressible seals (e.g., O-ring seals) 234. The outer target backing plate 117 may also include a plug 228 that may be welded or otherwise coupled to the outer target backing plate 117 to prevent the coolant from leaking. In some embodiments, the inner metal shunt 240 may by formed from martensitic (magnetic) stainless steel. The compressible seals 234 can be made out of synthetic rubber or fluoropolymer elastomer.

In some embodiments, the outer magnetron assembly 103 further includes outer magnets 112 coupled to a first movable outer shunt 218 that allows for vertical movement of the outer magnets 112. The outer magnets 112 include a lower pole 224 on an opposite end to where the outer magnets 112 are attached to the first outer shunt 218. The outer magnetron assembly 103 further includes a second stationary outer shunt 216 that is fixed in position with respect to outer magnets 112. In some embodiments, both the movable and stationary outer shunts 218, 216 are non-rating shunts that may be made of a conductive metallic material. In some embodiments, the shunts 216 and 218 may be formed from martensitic (magnetic) stainless steel.

The outer magnets 112 produce a magnetic field within the chamber 100, generally parallel and close to the surface of the outer target 116 to trap electrons and increase the local plasma density, which in turn increases the sputtering rate. The outer magnets 112 produce an electromagnetic field around the top of the chamber 100.

In some embodiments, a gap 150 between the inner target assembly 102 and an outer target assembly 103 may be formed. In some embodiments, the gap 150 may be between about 0.5 mm to about 2.5 mm wide. In some embodiments, the gap 150 may be about 1.5 mm. In some embodiments, the position of the gap 150 between items 114 and 116 is directly beneath one of the pairs of inner magnet 110. In some embodiments, the position of the gap 150 between inner and out targets 114 and 116 is directly beneath the outermost pair of inner magnet 110. The position of the gap 150 between inner and outer targets 114 and 116 directly beneath the outermost pair of inner magnet 110 advantageously creates an equal magnetic field inward and outward of the inner magnet 110 which enables separation of the plasmas allows full-face erosion of both cathodes (i.e., inner and outer targets 114 and 116). Full-face erosion helps to prevent re-deposition and thus particle formation. In addition, the portion of the gap 150 that continues between target backing plates 115 and 117 prevents metallic deposited material from coating the ceramic spacer 220 and causing an electrical short.

Vacuum seals 236 may be disposed throughout the chamber lid to prevent process gases from within the chamber from entering the chamber lid. In some embodiments, a compressive spring elements 302 is disposed between the inner magnetron housing 111 and the insulator 208 as shown in FIG. 3. The compressive spring element 302 applies a force to the inner magnetron housing 111 causing the inner magnetron housing 111 to compress the compressible vacuum seals 236. The vacuum seals 236 can be made out of synthetic rubber or fluoropolymer elastomer.

In some embodiments, inner target clamp screws 304 couple the inner magnetron housing 111 to the inner target backing plate 115. In some embodiments, outer target clamp screws 310 couple the outer magnetron housing 113 to the outer target backing plate 117.

While the foregoing is directed to embodiments of the present disclosure, other and further embodiments of the disclosure may be devised without departing from the basic scope thereof.

The invention claimed is:

1. A chamber lid of a physical vapor deposition chamber, comprising:
an inner magnetron assembly coupled to an inner target assembly, wherein the inner magnetron assembly includes a plurality of inner magnets disposed in an inner magnetron housing that is fluidly sealed and configured to hold a cooling liquid; and
an outer magnetron assembly coupled to an outer target assembly, wherein the outer magnetron assembly includes a one or more pairs of outer magnets disposed in an outer magnetron housing that includes one or more fluid channels that are fluidly coupled to a coolant channel formed in an outer target backing plate of the outer target assembly, and wherein the inner magnetron assembly, inner magnetron housing, and the inner target assembly are electrically isolated from the outer magnet assembly, outer magnetron housing, and the outer target assembly.

2. The chamber lid of claim 1, wherein the inner magnetron assembly includes a rotating magnetron, and wherein the outer magnetron assembly includes one or more stationary magnets.

3. The chamber lid of claim 1, wherein the inner magnetron assembly is coupled to a DC power source that is configured to provide DC pulsed power to the inner target assembly via the inner magnetron assembly.

4. The chamber lid of claim 3, wherein the outer magnetron assembly is coupled to the DC power source that is configured to provide DC pulsed power to the outer target assembly via the outer magnetron assembly.

5. The chamber lid of claim 4, wherein the DC power source is configured to provide pulsed DC power independently to the inner target assembly and the outer target assembly.

6. The chamber lid of claim 1, wherein the inner magnetron assembly includes a plurality of pairs of magnets coupled to a rotating shunt.

7. The chamber lid of claim 1, wherein the outer magnetron assembly includes an outer pair of magnets coupled to a non-rotating shunt.

8. The chamber lid of claim 7, wherein the non-rotating shunt is vertically movable to adjust a vertical distance of the outer pair of magnets from the outer target assembly.

9. The chamber lid of claim 1, wherein a gap disposed between the inner target assembly and the outer target assembly is about 0.5 mm to about 2.5 mm wide and disposed beneath a pair of inner magnets included in the inner magnetron assembly.

10. A physical vapor deposition chamber, comprising:
an inner magnetron assembly electrically coupled to an inner target assembly, wherein the inner magnetron assembly includes an inner magnetron housing configured to contain a coolant; and
an outer magnetron assembly electrically coupled to an outer target assembly, wherein the inner magnetron assembly and the inner target assembly are electrically isolated from the outer magnet assembly and the outer target assembly, wherein the outer target assembly includes an outer target backing plate including a coolant channel, and wherein the outer magnet assembly includes an outer magnetron housing with a coolant channel formed therein to supply coolant to the coolant channel formed in the outer target assembly.

11. The physical vapor deposition chamber of claim 10, wherein the inner magnetron assembly includes a rotating magnetron, and wherein the outer magnetron assembly includes one or more stationary magnets.

12. The physical vapor deposition chamber of claim 10, wherein the inner magnetron housing is coupled to a DC power source that is configured to provide DC pulsed power to the inner target assembly via the inner magnetron housing.

13. The physical vapor deposition chamber of claim 12, wherein the outer magnetron housing is coupled to the DC power source that is configured to provide DC pulsed power to the outer target assembly via the outer magnetron housing.

14. The physical vapor deposition chamber of claim 13, wherein the DC power source is configured to provide pulsed DC power independently to the inner target assembly and the outer target assembly.

15. The physical vapor deposition chamber of claim 10, wherein the inner magnetron assembly includes a plurality of pairs of magnets coupled to a rotating shunt.

16. The physical vapor deposition chamber of claim 10, wherein the outer magnetron assembly includes an outer pair of magnets coupled to a non-rotating shunt.

17. The physical vapor deposition chamber of claim 16, wherein the non-rotating shunt is vertically movable to adjust a vertical distance of the outer pair of magnets from the outer target assembly.

18. A physical vapor deposition chamber, comprising:
a chamber body having a first volume;
a chamber lid disposed atop the chamber body, comprising:
  an inner rotating magnetron assembly electrically coupled to an inner target assembly, wherein the inner magnetron assembly includes a plurality of inner magnets disposed in an inner magnetron housing that is fluidly sealed and configured to hold a cooling liquid; and
  an outer non-rotating magnetron assembly electrically coupled to an outer target assembly, wherein the outer non-rotating magnetron assembly includes a one or more pairs of outer magnets disposed in an outer magnetron housing includes one or more fluid channels that are fluidly coupled to a coolant channel formed in an outer target backing plate of the outer target assembly, and wherein the inner rotating magnetron assembly and the inner target assembly are electrically isolated from the outer non-rotating magnet assembly and the outer target assembly;
a DC power source that is configured to provide DC pulsed power to the inner target assembly and the outer target assembly;
a substrate support disposed within the first volume, opposite the inner target assembly and the outer target assembly, and having a substrate processing surface; and
a shield disposed within the chamber body comprising one or more sidewalls configured to surround the first volume, wherein the shield extends downwardly to below a top surface of the substrate.

* * * * *